(12) United States Patent
Yokotani et al.

(10) Patent No.: US 6,169,396 B1
(45) Date of Patent: *Jan. 2, 2001

(54) SENSING DEVICE FOR DETECTING CHANGE IN AN APPLIED MAGNETIC FIELD ACHIEVING HIGH ACCURACY BY IMPROVED CONFIGURATION

(75) Inventors: Masahiro Yokotani; Izuru Shinjo, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/896,166

(22) Filed: Jul. 17, 1997

(30) Foreign Application Priority Data

Feb. 19, 1997 (JP) ....................................... 9-035108

(51) Int. Cl.$^7$ .............................. G01B 7/30; G01R 33/09; G01D 5/14
(52) U.S. Cl. ................................ 324/207.21; 324/207.12; 324/207.25; 324/252
(58) Field of Search ..................................... 324/173, 174, 324/207.12, 207.21, 207.25, 252; 338/32 R

(56) References Cited

U.S. PATENT DOCUMENTS

| | | | |
|---|---|---|---|
| 4,039,936 | * 8/1977 | Jones et al. | 324/207.21 |
| 4,673,827 | * 6/1987 | Sommer | 324/207.21 X |
| 4,893,027 | * 1/1990 | Kammerer et al. | 324/207.2 X |
| 5,038,130 | * 8/1991 | Eck et al. | 338/32 R |
| 5,341,097 | * 8/1994 | Wu | 324/207.2 |
| 5,477,143 | * 12/1995 | Wu | 324/207.21 |
| 5,744,950 | * 4/1998 | Seefeldt | 324/252 X |
| 5,801,529 | * 9/1998 | Umemto et al. | 324/207.21 X |

FOREIGN PATENT DOCUMENTS

| | | |
|---|---|---|
| 195 80 095 C2 | 2/1996 | (DE) . |
| 44 34 912 A1 | 4/1996 | (DE) . |
| 196 49 400 A1 | 12/1997 | (DE) . |
| 2-78913 | * 3/1990 | (JP) ................................. 324/207.21 |
| WO 96/22543 | 7/1996 | (WO) . |

OTHER PUBLICATIONS

Journal of Magnetics Society of Japan, vol. 15, No. 5, 1991 "Magnetoresistance of Multilayers", Yamamoto et al.

* cited by examiner

*Primary Examiner*—Gerard Strecker
(74) *Attorney, Agent, or Firm*—Sughrue, Mion, Zinn, Macpeak & Seas, PLLC

(57) ABSTRACT

A sensing device capable of obtaining an output signal corresponding precisely to a predetermined position (angle), for example, of a protruding or recessed portion of a moving magnetic-material member without being affected by temperature change. The sensing device includes: a magnet for generating a magnetic field; a rotary magnetic material member for changing the magnetic field generated by the magnet, the rotary member being disposed at a predetermined distance apart from the magnet; and a giant magnetoresistance element for detecting the change in the magnetic field induced by the rotary magnetic material member and generating a plurality of outputs having a peak value different from each other, the operating range of the giant magnetoresistance element being set such that a uniform change in resistance occurs over the operating range regardless of the direction of change in the magnetic field induced by the rotary magnetic material member, wherein the center of the giant magnetoresistance element is shifted from the center of the magnet in a direction parallel to a plane including the direction of the change in magnetic field induced by the rotary magnetic material member.

4 Claims, 11 Drawing Sheets

DIRECTION OF CHANGE IN MAGNETIC FIELD

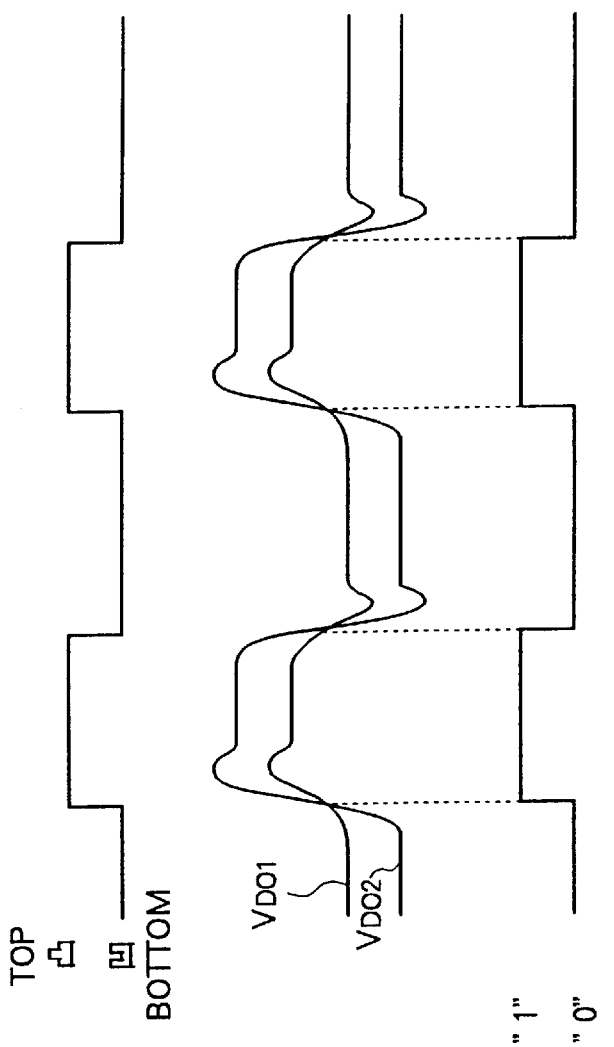

DIRECTION OF CHANGE IN MAGNETIC FIELD

DIRECTION OF CHANGE IN MAGNETIC FIELD

FIG. 12B OUTPUT OF DIFFERENTIAL AMPLIFIER

FIG. 12C OUTPUT OF WAVEFORM SHAPING CIRCUIT

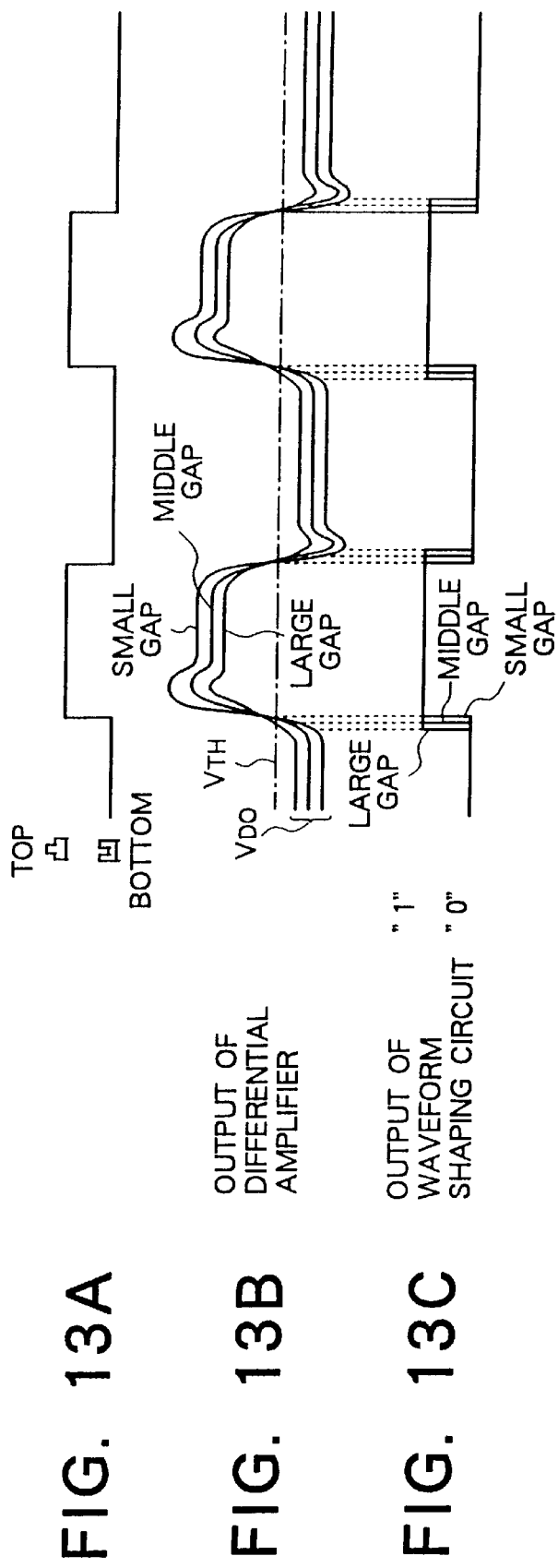

US 6,169,396 B1

SENSING DEVICE FOR DETECTING CHANGE IN AN APPLIED MAGNETIC FIELD ACHIEVING HIGH ACCURACY BY IMPROVED CONFIGURATION

BACKGROUND OF THE INVENTION

1. Field of the Invention

The present invention relates to a sensing device for detecting a change in an applied magnetic field, and more particularly, to a sensing device which is particularly suitable for detecting the information about the rotation of, for example, an internal combustion engine.

2. Description of the Related Art

A magnetoresistance (MR) element is widely used to detect a magnetic field. This device changes in resistance in response to the direction of a magnetic field applied to a thin film of a ferromagnetic material (such as Ni—Fe, Ni—Co) with respect to the direction of a current flowing through the thin ferromagnetic film. However, the output level of the MR device is not high enough to achieve high-accuracy detection. To solve this problem, a magnetic field sensing device using a giant magnetoresistance (GMR) element capable of providing a high-level output signal has recently been proposed.

The GMR element has a multilayer structure consisting of alternating magnetic layers and non-magnetic layers each having a thickness in the range from a few Å to a few tens of Å. Such a multilayer structure is known as the superlattice structure, and a specific example is disclosed in a paper entitled "Magnetoresistance effect of superlattice" published in the Journal of Magnetics Society of Japan, Vol. 15, No.51991, pp.813–821. Specific structures includes (Fe/Cr) n, (permalloy/Cu/Co/Cu)n, (Co/Cu)n, etc. These superlattice structures exhibit much greater magnetoresistance effect (change in magnetoresistance) than conventional MR devices. In these GMR elements with superlattice structure, the magnetoresistance effect depends only on the relative jangle between magnetization of adjacent magnetic layers, and therefore the change in resistance does not depend on the direction of the external magnetic field applied with respect to the direction of current (this property is referred to as "in-plane magnetic field sensitivity).

Taking the above advantage, it has been proposed to construct a magnetic field sensing device with GMR elements in which a magnetic field sensing plane for detecting the change in the magnetic field is formed substantially with GMR elements, wherein electrodes are formed so that the respective GMR elements are connected in such a manner as to form a bridge circuit, to which a voltage Vcc and ground are applied. The change in resistance of the GMR elements is converted into a change in voltage via the bridge circuit, thereby detecting the change in the magnetic field applied to the GMR elements. In the GMR element, it is possible to have hysteresis in the characteristic of resistance versus applied magnetic field by optimizing the film thicknesses of the magnetic and non-magnetic layers within the range from a few Å to a few tens of Å.

However, in a sensing device constructed with a GMR bridge circuit, the above-described hysteresis varies from element to element due to the variations in response characteristics, or the overall temperature coefficient, among GMR elements constituting the bridge circuit. As a result, an imbalance occurs between the resistance change of GMR elements located on a pair of opposite sides of the bridge and the resistance change of GMR elements located on the other pair of opposite sides. This makes it difficult to obtain a high-accuracy signal in detection. One known technique to solve the above problem is to construct a magnetic field sensing device by positioning GMR elements so that there is a deviation between the center of the magnetic field sensing plane of the GMR elements and a magnet thereby ensuring that the sensing device operates at an operating point where a greater hysteresis occurs.

FIG. 9 is a schematic diagram illustrating such a sensing device, wherein its side view and plan view are shown in FIGS. 9a and 9b, respectively. This sensing device includes: a rotating shaft 1; a rotary magnetic material member 2 serving as magnetic field variation inducing means having at least one protruding or recessed portion and being adapted to rotate in synchronization with the rotation of the rotating shaft 1; a GMR element 3 disposed at a location a predetermined distance apart from the rotary magnetic material member 2; and a magnet 4 serving as magnetic field generating means for supplying a magnetic field to the GMR element 3, wherein the GMR element 3 includes a magnetoresistance pattern 3a serving as a magnetic field sensing pattern formed on a thin film plane (magnetic field sensing plane). Furthermore, as shown in FIG. 9B, the GMR element 3 is disposed so that the center of the magnetic field sensing plane of the GMR element 3 is shifted by a predetermined amount L from the center of the magnet 4, for example, in a direction opposite to the rotation direction of the rotary magnetic material member 2. In this structure, the magnetic field applied to the sensing plane of the GMR element 3 changes in response to the rotation of the rotary magnetic material member 2, and a corresponding change occurs in the resistance of the magnetoresistance pattern 3a.

FIG. 10 is a block diagram illustrating the construction of the sensing device using the GMR elements having the property of hysteresis. This sensing device includes: a Wheatstone bridge circuit 11 including GMR elements disposed a predetermined distance apart from the rotary magnetic material member 2 so that a magnetic field is applied from a magnet 4 to the GMR elements; a differential amplifier 12 for amplifying the output signal of the Wheatstone bridge circuit 11; a comparator 13 for comparing the output of the differential amplifier 12 with a reference value and outputting either a "0" signal or a "1" signal depending on the comparison result; a waveform shaping circuit 14 for shaping the waveform of the output of the comparator 13 and supplying a "0" or "1" signal having sharply rising and falling edges to the output terminal 15; and a temperature compensation circuit 20 for correcting the reference value (threshold value) associated with the comparator 13 in accordance with the temperature coefficients of the GMR elements.

FIG. 11 is a circuit diagram illustrating a specific example of the circuit shown in FIG. 10. The Wheatstone bridge circuit 11 includes GMR elements 10A, 10B, 10C, and 10D disposed on the respective branches of the bridge, wherein one end of the GMR element 10A and one end of the GMR element 10C are connected in common to a power supply terminal Vcc via a node 16, one end of the GMR element 10B and one end of the GMR element 10D are connected in common to ground via a node 17, the other end of the GMR element 10A and the other end of the GMR element 10B are connected to a node 18, and the other end of the GMR element 10C and the other end of the GMR element 10D are connected to a node 19. Although in a practical device the GMR elements 10A, 10B, 10C, and 10D are formed in a separate fashion in the magnetoresistance pattern 3a of the GMR element 3, these GMR elements 10A, 10B, 10C, and 10D are generically represented by the GMR element 3 in FIG. 9.

The node 18 of the Wheatstone bridge circuit 11 is connected, via a resistor, to the inverting input of an amplifier 12a constituting a differential amplifier 12. The node 19 is connected, via a resistor, to the non-inverting input of the amplifier 12a. The output of the amplifier 12a is connected to the inverting input of a comparator 13 via a resistor. The non-inverting input of the comparator 13 is connected to a voltage divider serving as a reference power supply, wherein the non-inverting input of the comparator 13 is also connected via a resistor to the output of the comparator 13. The output of the comparator 13 is connected to the base of a transistor 14a of a waveform shaping circuit 14. The collector of the transistor 14a is connected to an output terminal 15 and also to a power supply terminal Vcc via a resistor. The emitter of the transistor 14a is grounded.

The non-inverting input terminal of the amplifier 20a of the temperature compensation circuit 20 is connected to a dividing circuit serving as a reference power supply and composed of resistors 20b and 20c. The inverting input terminal of the amplifier 20a is connected, at $V_{TH}$, to the earlier-described dividing circuit serving as the reference power supply for the comparator 13. The resistors 20b and 20c are selected so that they have a temperature coefficient close to that of the GMR elements of the Wheatstone bridge 11.

The operation will be described below with reference to FIG. 12. If the rotary magnetic material member 2 rotates, the magnetic field applied to the GMR elements 10A to 10D changes in response to the passage of the protruding and recessed portions of the rotary member 2 of magnetic material shown in FIG. 12A, wherein the magnetic fields applied to the GMR elements 10A and 10D are equal in phase while the magnetic fields applied to the GMR elements 10B and 10C are opposite in phase to those applied to the GMR elements 10A and 10D. As a result, the magnetic field sensing planes of the GMR elements 10A, 10D and those of 10B and 10C experience the change in the magnetic field corresponding to the protruding and recessed portion of the rotary magnetic material member 2. As a result, the overall magnitude of the change in the magnetic field becomes, in effect, four times greater than that which can be sensed by a single GMR element. Thus, the GMR elements 10A and 10D have maximum and minimum resistances at locations opposite in phase to those where the GMR elements 10B and 10C have maximum and minimum resistances. As a result, the voltages at the nodes 18 and 19 (mid-point voltages) of the Wheatstone bridge circuit also change in a similar fashion.

The difference between the mid-point voltages is amplified by the differential amplifier 12. Thus, as shown in FIG. 12B, the differential amplifier 12 outputs a signal corresponding to the passage of the protruding and recessed portions of the rotary magnetic material member 2 shown in FIG. 12A. The output signal of the differential amplifier 12 is substantially four times greater than can be obtained by a single GMR element. The output of the differential amplifier 12 is applied to the comparator 13, and is compared with the reference value, or threshold value, $V_{TH}$. The comparator 13 outputs a "0" or "1" signal in accordance with the comparison result. The temperature compensation circuit 20 adjusts the reference value $V_{TH}$ associated with the comparison circuit 13 in accordance with the temperature coefficient of the GMR elements, so that the sensing device is not affected by the temperature-dependent change characteristic of the GMR elements.

The output signal of the comparator 13 is shaped by the waveform shaping circuit 14 so that a "0" or "1" output signal having sharply rising and falling edges is obtained at the output terminal 15 as shown in FIG. 12C wherein the output signal corresponds precisely to the protruding and recessed portions of the rotary magnetic material member 2.

The above-described sensing device using GMR elements has problems as described below with reference to FIG. 13, illustrating, for the FIG. 12 circuit, the relationship between the output of the waveform shaping circuit 14 and the output of the differential amplifier 12 corresponding to the detection of protruding and recessed portions of the rotary magnetic material member 2. Since the GMR elements have hysteresis in the characteristic of the resistance versus the applied magnetic field, the output changes at the edges of the protruding and recessed portions of the rotary magnetic material member 2. Furthermore, the hysteresis also causes a difference between the output for the recessed portions and that for the protruding portions.

That is, the resistance of the GMR elements changes in accordance with the distance from the rotary magnetic material member 2 (hereinafter this distance will be referred to simply as the gap), and therefore the resistance of the GMR elements changes depending on whether they face a protruding portion or a recessed portion of the rotary magnetic material member 2. As a result, as shown in FIG. 13B, the level of the output $V_{DO}$ of the differential amplifier 12 changes in accordance with the magnitude of the gap. More specifically, in this example, the output level increases with a reduction in the gap. Thus, when the comparator 13 compares the output $V_{DO}$ of the differential amplifier 12 with the reference value $V_{TH}$, the point where the output crosses the reference value changes depending on the magnitude of the $V_{DO}$ output level. As a result, the width of a pulse appearing at the output of the waveform shaping circuit 14 changes as shown in FIG. 13C. More specifically, the pulse width decreases with a reduction in the gap. This causes degradation in the accuracy of correspondence between the detected output signal and the protruding and recessed portions of the rotary magnetic material member 2. To avoid the above problem of the conventional sensing device, it is required to make a fine adjustment so that the reference level associated with the comparator 13 is set to a particular value which minimizes the above gap-dependent change. Furthermore, the temperature compensation circuit 20 has to be added to the sensing device so as to control the reference value associated with the comparator 13 in accordance with the temperature coefficient of the GMR elements.

In view of the above problems, it is an object of the present invention to provide a sensing device with a simple circuit configuration capable of obtaining an output signal corresponding precisely to a position (angle), such as for a protruding or recessed portion of a moving magnetic-material member, without being affected by temperature change.

SUMMARY OF THE INVENTION

According to one aspect of the invention, there is provided a sensing device including: magnetic field generating means for generating a magnetic field; magnetic field variation inducing means for changing the magnetic field generated by the magnetic field generation means, the magnetic field variation inducing means being disposed a predetermined distance apart from the magnetic field generation means; and magnetic field detecting means for detecting the change in the magnetic field induced by said magnetic field variation inducing means and then generating a plurality of outputs having a peak value different from each other, the operating range of said magnetic field detecting means being set such that a uniform change in resistance occurs over the operating range regardless of the direction of change in the magnetic field induced by said magnetic field variation inducing means; wherein the center of said magnetic field detecting means is shifted from the center of said magnetic field generating means in a direction parallel to a plane including the direction of the change in magnetic field induced by said magnetic field variation inducing means.

According to this arrangement, it becomes possible to obtain an output signal corresponding precisely to a predetermined position (angle) of the magnetic field variation inducing means without being affected by variations in the characteristics or temperature coefficients of the magnetic field detecting means and, thus, the detection accuracy is improved.

In one form of the invention: said magnetic field generating means includes a plurality of magnets; said magnetic field detecting means includes a plurality of giant magnetoresistance elements corresponding to said plurality of magnets; said plurality of giant magnetoresistance elements are disposed in such a manner that the center of the magnetic field sensing plane of said plurality of giant magnetoresistance elements is shifted from the center of the magnetic pole of said plurality of magnets; and said plurality of giant magnetoresistance elements are disposed at locations different from each other with respect to said magnetic field variation inducing means.

According to this arrangement, it is possible to obtain an output signal corresponding precisely to a predetermined position (angle) of the magnetic field variation inducing means without being affected by variations in the characteristics or temperature coefficients of the giant magnetoresistance elements and, thus, the detection accuracy is improved.

In another form of the invention: said magnetic field generating means includes a single magnet; said magnetic field detecting means includes a giant magnetoresistance element corresponding to said magnet; and said giant magnetoresistance element includes a plurality of magnetoresistance patterns formed on the magnetic field sensing plane of said giant magnetoresistance element, said plurality of magnetoresistance patterns being located at positions corresponding to said plurality of outputs having different peak values, the magnetoresistance pattern for generating an output having the greatest peak value of said plurality of magnetoresistance patterns being located at a position which results in the greatest change in resistance.

According to this arrangement, it is possible to obtain an output signal corresponding precisely to a predetermined position (angle) of the magnetic field variation inducing means without being affected by variations in the characteristics or temperature coefficient of-the giant magnetoresistance element and, thus, the detection accuracy is improved. Furthermore, in this arrangement the sensing device requires only one set of GMR elements and a magnet for applying a magnetic field to the GMR elements. This allows simplification in structure and reduction in the size of the sensing device.

In a further form of the invention: a bridge circuit is constructed using said plurality of giant magnetoresistance elements; and a magnetic field is applied to said plurality of giant magnetoresistance elements in such a manner that the magnetic field applied to the giant magnetoresistance element located on one side of said bridge circuit is different in polarity from that applied to the giant magnetoresistance element located on another side of said bridge circuit.

According to this arrangement, it is possible to obtain an output signal corresponding precisely to a predetermined position (angle) of the magnetic field variation inducing means. Furthermore, since the operation is based on the detection of a crossing point of two signals in the same phase, the operation is less affected by external noise.

In a still further form of the invention, the sensing device further includes means for detecting a crossing point between the outputs of the giant magnetoresistance elements located on the respective sides of said bridge circuit.

According to this arrangement, the comparator located at a stage following the bridge circuit can perform the comparison operation without having to use a reference level, and it is possible to obtain an output signal corresponding precisely to a predetermined position (angle) of the magnetic field variation inducing means without being affected by variations in the characteristics or temperature coefficient of the giant magnetoresistance element and, thus, the detection accuracy is improved. Furthermore, this arrangement allows simplification in the circuit configuration.

In a further form of the invention, said means for detecting the crossing point includes a differential amplifier having a plurality of amplifiers for amplifying the mid-point voltages of said bridge circuit, and a comparator for comparing the outputs of said plurality of amplifiers with each other.

According to this arrangement, the comparator located at a stage following the bridge circuit can perform the comparison operation without having to use a reference level, and it is possible to obtain an output signal corresponding precisely to a predetermined position (angle) of the magnetic field variation inducing means without being affected by variations in the characteristics or temperature coefficient of the giant magnetoresistance element and, thus, the detection accuracy is improved. Furthermore, this arrangement allows simplification in the circuit configuration.

In a still another form of the invention, said magnetic field variation inducing means is a rotary magnetic material member including at least one protruding or recessed portion adapted to rotate in synchronization with a rotating shaft.

According to this arrangement, it is possible to obtain an output signal corresponding precisely to the protruding or recessed portion of the rotary magnetic material member. Furthermore, it is possible to achieve a reduction in the size, an improvement in the detection accuracy, and a reduction in cost.

BRIEF DESCRIPTION OF THE DRAWINGS

FIGS. 4A–4C are waveform diagrams illustrating the operation of the first embodiment of the sensing device according to the present invention;

FIGS. 12A–12C are waveform diagrams illustrating the operation of the circuit shown in FIG. 11; and FIGS. 13A–13C are waveform diagrams illustrating some problems associated with the sensing device shown in FIG. 9.

DESCRIPTION OF THE PREFERRED EMBODIMENTS

The sensing device of the present invention will be described in further detail below with reference to preferred embodiments in conjunction with the drawings.

Embodiment 1

Figure 1A:
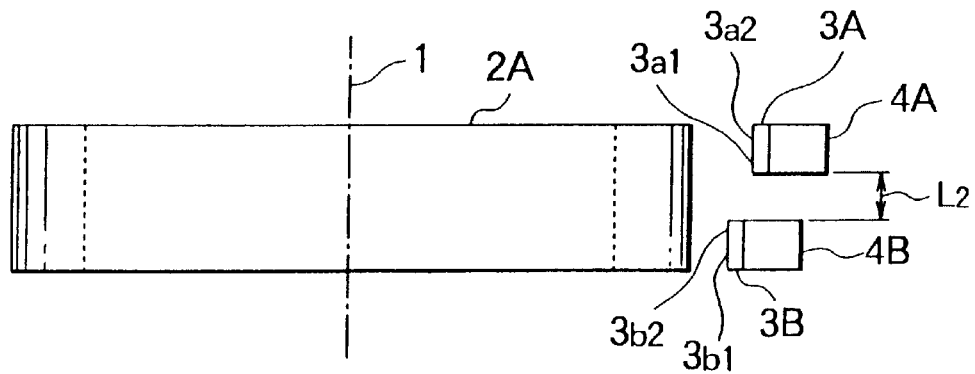
FIGS. 1A and 1B are schematic diagrams illustrating a first embodiment of a sensing device according to the present invention.
Figure 1B:
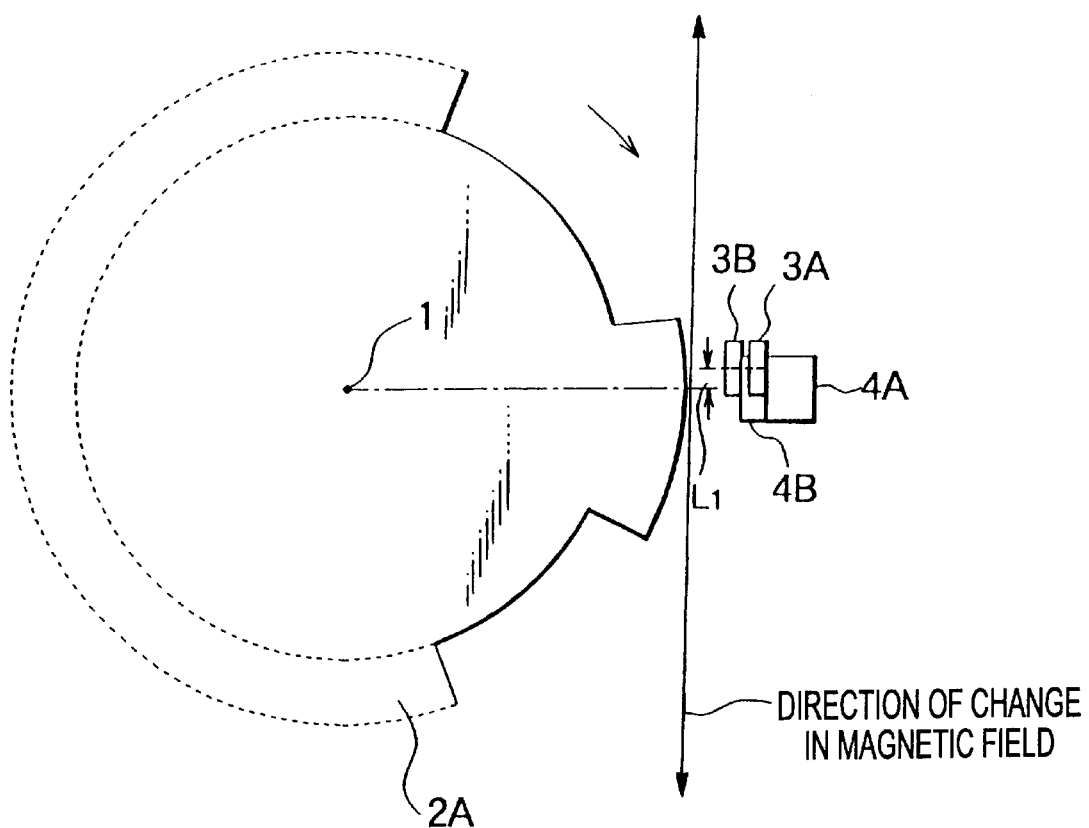
Figure 9A:
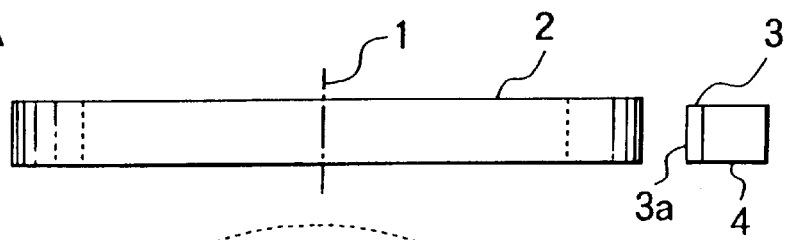
FIGS. 9A and 9B are schematic diagrams illustrating a sensing device using a GMR element.
Figure 9B:
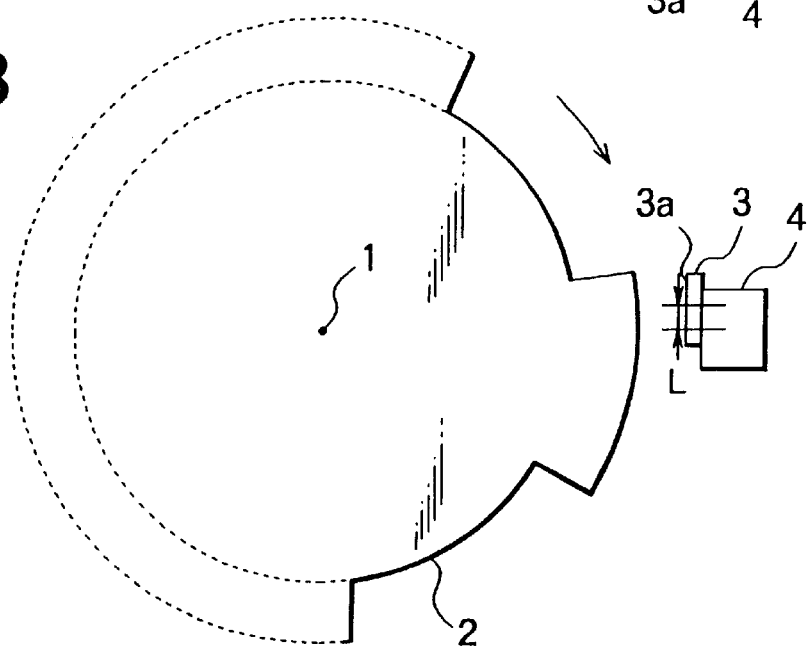
Figure 10:
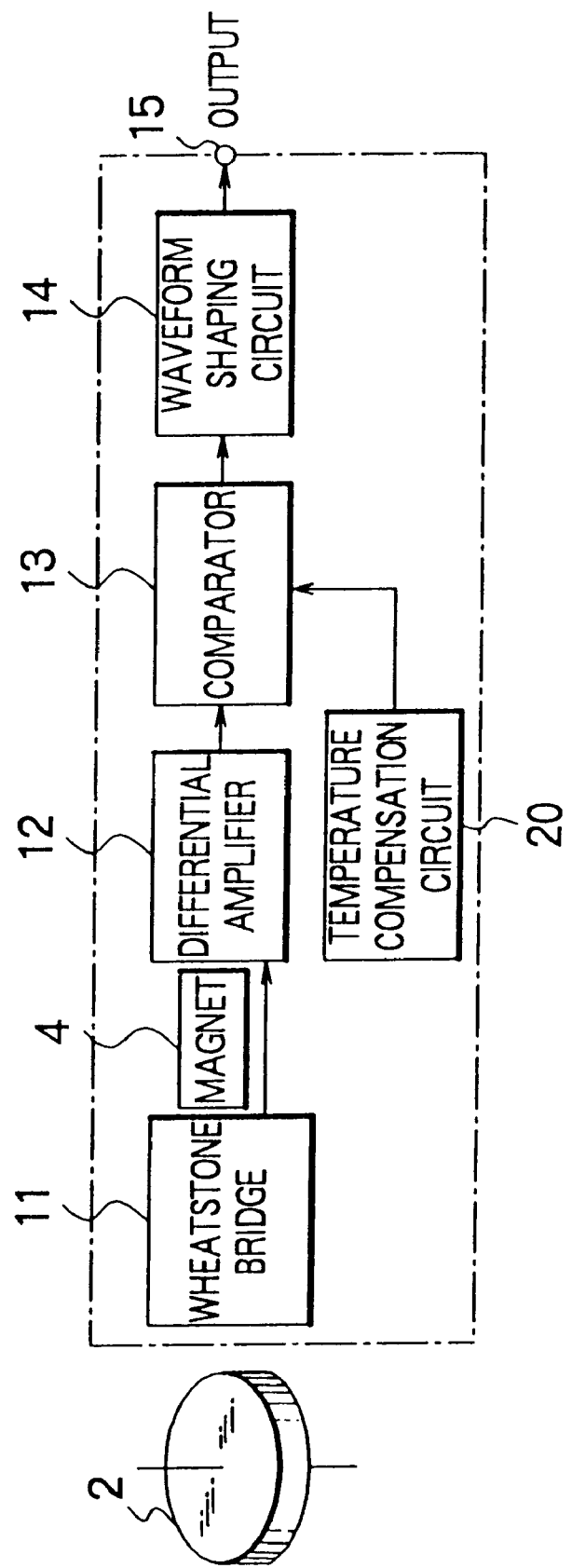
FIG. 10 is a block diagram illustrating the basic circuit configuration of a sensing device using a GMR element according to the present invention.

FIG. 1 is a schematic diagram illustrating a first embodiment of the present invention, wherein its side view and plan view are shown in FIGS. 1A and 1B, respectively, in which similar elements and parts to those in FIG. 9 are denoted by similar reference numerals, and they are not described in further detail here. This sensing device includes: a rotating shaft 1; a rotary magnetic material member 2A serving as magnetic field variation inducing means having at least one protruding or recessed portion and adapted to rotate in synchronization with the rotation of the rotating shaft 1; GMR elements 3A and 3B serving as magnetic field sensing means disposed at different locations at predetermined distances apart from the rotary magnetic material member 2A; and magnets 4A and 4B serving as magnetic field generating means for supplying a magnetic field to the GMR elements 3A and 3B. The GMR element 3A includes a plurality of magnetoresistance patterns 3a1 and 3a2, serving as magnetic field sensing patterns, formed on the surface of a thin film (magnetic field sensing plane). Similarly, the GMR element 3B includes a plurality of magnetoresistance patterns 3b1 and 3b2, serving as magnetic field sensing patterns, formed on the surface of a thin film (magnetic field sensing plane).

In this structure, as shown in FIG. 1B, the GMR elements 3A and 3B are disposed so that the centers of the magnetic field sensing planes of the respective GMR elements 3A and 3B are shifted by a predetermined amount $L_1$ from the centers of the magnets 4A and 4B, for example, in a direction opposite to the rotation direction of the rotary magnetic material member 2A. The specific value of $L_1$ is preferably within the range from 0.1 to 10 mm, while the optimum value depends on the size of the GMR device. The direction of the change in the magnetic field that results from the action of the magnetic field variation inducing means is shown in FIG. 1B. The magnetic field variation inducing means causes this direction of the generated magnetic field to be changed along a plane that is essentially parallel to the magnetic field sensing planes of the GMR elements and essentially parallel to the alternating faces of the magnetic field variation inducing means, the faces facing the GMR elements. The same features apply, respectively, to corresponding parts of FIGS. 5B and 6, as shown therein.

In the specific example shown in FIG. 1, the GMR elements 3A and 3B are disposed at locations predetermined distances apart from the rotary magnetic material member 2A such that the gap between the GMR element 3B and the rotary magnetic material member 2A is smaller than the gap between the GMR element 3A and the rotary magnetic material member 2A, wherein the GMR elements 3A and 3B are also spaced from each other by a predetermined amount $L_2$ so that no characteristic interference occurs between the elements. Taking into consideration the fact that there are a plurality of GMR elements, it is desirable that the rotary magnetic material member 2A have a thickness greater than that of the conventional rotary magnetic material member 2 shown in FIG. 9. Alternatively, the thickness of the respective GMR elements 3A and 3B may be decreased instead of increasing the thickness of the rotary magnetic material member 2A. The other parts are constructed in the same manner as in FIG. 9.

Figure 2:
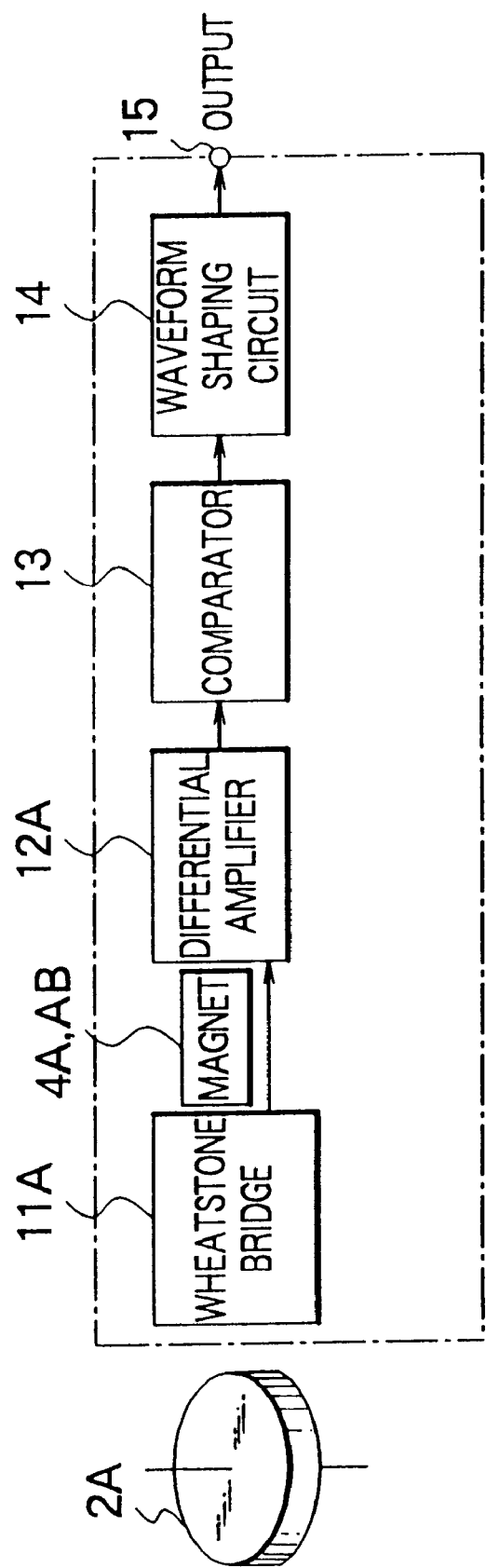
FIG. 2 is a block diagram illustrating the basic circuit configuration of the sensing device using GMR elements according to the present invention.

FIG. 2 is a block diagram illustrating a sensing device using the above-described GMR elements having the property of hysteresis. This sensing device includes: a Wheatstone bridge circuit 11A including a plurality of GMR elements disposed predetermined distances apart from the rotary magnetic material member 2A so that a magnetic field is applied from magnets 4A and 4B to the respective GMR elements; a differential amplifier 12A for amplifying the output signal of the Wheatstone bridge circuit 11A; a comparator 13 for comparing the output of the differential amplifier 12A with a reference value and outputting a "0" signal or a "1" signal depending on the comparison result; a waveform shaping circuit 14 for shaping the waveform of the output of the comparator 13 and supplying a "0" or "1" signal having sharp rising and falling edges to the output terminal 15.

Figure 3:
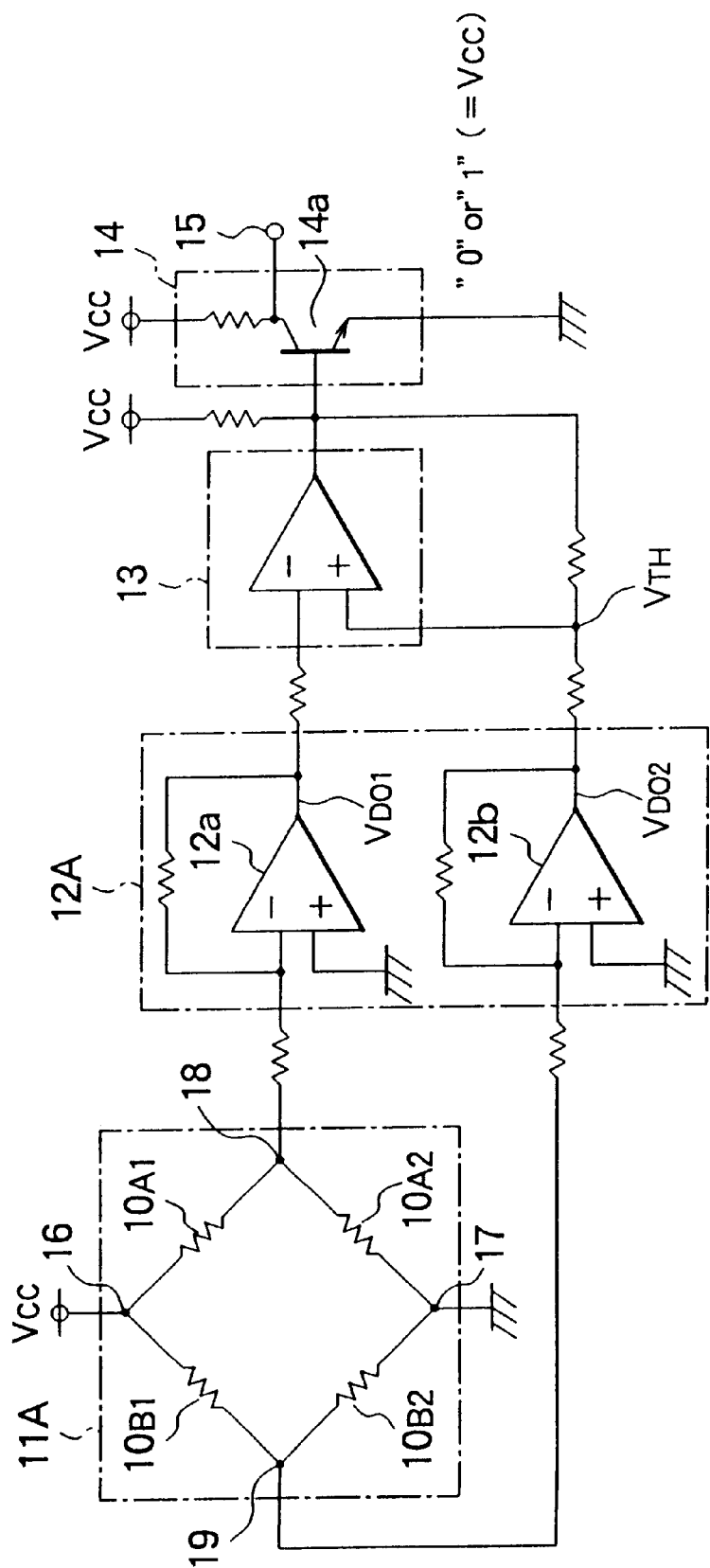
FIG. 3 is a circuit diagram illustrating a specific example of the circuit shown in FIG. 2.

FIG. 3 is a circuit diagram illustrating a specific example of the circuit shown in FIG. 2. The Wheatstone bridge circuit 11A includes GMR elements $10A_1$, $10A_2$, $10B_1$, and $10B_2$ disposed on the respective branches of the bridge, wherein one end of the GMR element $10A_1$ and one end of the GMR element $10B_1$ are connected in common to a power supply terminal Vcc via a node 16, one end of the GMR element $10A_2$ and one end of the GMR element $10B_2$ are connected in common to ground via a node 17, the other end of the GMR element $10A_1$ and the other end of the GMR element $10A_2$ are connected to a node 18, and the other end of the GMR element $10B_1$ and the other end of the GMR element $10B_2$ are connected to a node 19. The GMR elements $10A_1$ and $10A_2$ correspond to the magnetoresistance patterns 3a1 and 3a2 shown in FIG. 1, respectively. Similarly, the GMR elements $10B_1$ and $10B_2$ correspond to the magnetoresistance patterns 3b1 and 3b2 shown in FIG. 1, respectively. However, in FIG. 1, the magnetoresistance patterns 3a1 and 3a2 are denoted by the GMR element 3A in a generic fashion, and the magnetoresistance patterns 3b1 and 3b2 are denoted by the GMR element 3B in a generic fashion.

The node 18 of the Wheatstone bridge circuit 11A is connected via a resistor to the inverting input of an amplifier 12a in the differential amplifier 12A. The node 19 is connected via a resistor to the inverting input of an amplifier 12b. The non-inverting inputs of the amplifiers 12a and 12b are both grounded. The output of the amplifier 12a is connected to the inverting input of a comparator 13 and the output of the amplifier 12b is connected to the non-inverting input of the comparator 13. The non-inverting input of the comparator 13 is also connected via a resistor to the output of the comparator 13 itself. The output of the comparator 13 is connected to the base of a transistor 14a of a waveform shaping circuit 14. The collector of the transistor 14a is connected to an output terminal 15 and also to a power supply terminal Vcc via a resistor. The emitter of the transistor 14a is grounded.

The operation will now be described below with reference to FIG. 4. If the rotary magnetic material member 2A rotates, the magnetic field applied to the respective GMR elements changes in response to the passage of the protruding and recessed portions of the rotary magnetic material member 2A as shown in FIG. 4A, wherein the magnetic fields applied to the GMR elements $10A_1$ and $10B_1$ are equal in phase while the magnetic fields applied to the GMR elements $10A_2$ and $10B_2$ are opposite in phase to those applied to the GMR elements $10A_1$ and $10B_1$. As a result, the magnetic field sensing planes of the GMR elements $10A_1$, $10B_1$ and those of $10A_2$ and $10B_2$ experience the change in the magnetic field corresponding to the protruding and recessed portion of the rotary magnetic material member 2A. Therefore, these elements have a corresponding resistance change and, thus, the GMR elements $10A_1$ and $10B_1$ have maximum and minimum resistances at locations opposite in phase to those where the GMR elements $10A_2$ and $10B_2$ have maximum and minimum resistances. As a result, the voltages at the nodes 18 and 19 (mid-point voltages) of the Wheatstone bridge circuit 11A also change in a similar fashion.

Since the GMR element 3A, corresponding to the GMR elements $10A_1$ and $10A_2$ (magnetoresistance patterns $3a1$ and $3a2$) of the Wheatstone bridge circuit 11A, is disposed at a location a greater distance from the rotary magnetic material member 2A than the GMR element 3B, corresponding to the GMR elements $10B_1$ and $10B_2$ (magnetoresistance patterns $3b1$ and $3b2$), the voltage obtained between the nodes 18 and 17 of the Wheatstone bridge circuit 11A is different from the voltage obtained between the nodes 19 and 17. In this specific example, the voltage between the nodes 19 and 17 is greater than that between the nodes 18 and 17.

The voltage obtained between the nodes 18 and 17 is supplied to the amplifier 12a of the differential amplifier 12A and compared with a reference voltage (ground voltage). The difference relative to the reference voltage is amplified, and thus an output voltage $V_{DO1}$, corresponding to the successive protruding and recessed portions of the rotary magnetic material member 2A shown in FIG. 4A, is obtained as shown in FIG. 4B.

Similarly, the voltage obtained between the nodes 19 and 17 is supplied to the amplifier 12b of the differential amplifier 12A and compared with the reference voltage (ground voltage). The difference relative to the reference voltage is amplified, and, thus, an output voltage $V_{DO2}$, corresponding to the successive protruding and recessed portions of the rotary magnetic material member 2A shown in FIG. 4A, is obtained as shown in FIG. 4B. As can be seen from FIG. 4B, the output voltage $V_{DO2}$ of the amplifier 12b has a greater peak level than the output voltage $V_{DO1}$ of the amplifier 12a by an amount resulting from the fact that the GMR element 3B is located nearer to the rotary magnetic material member 2A than the GRM element 3A.

Figure 11:
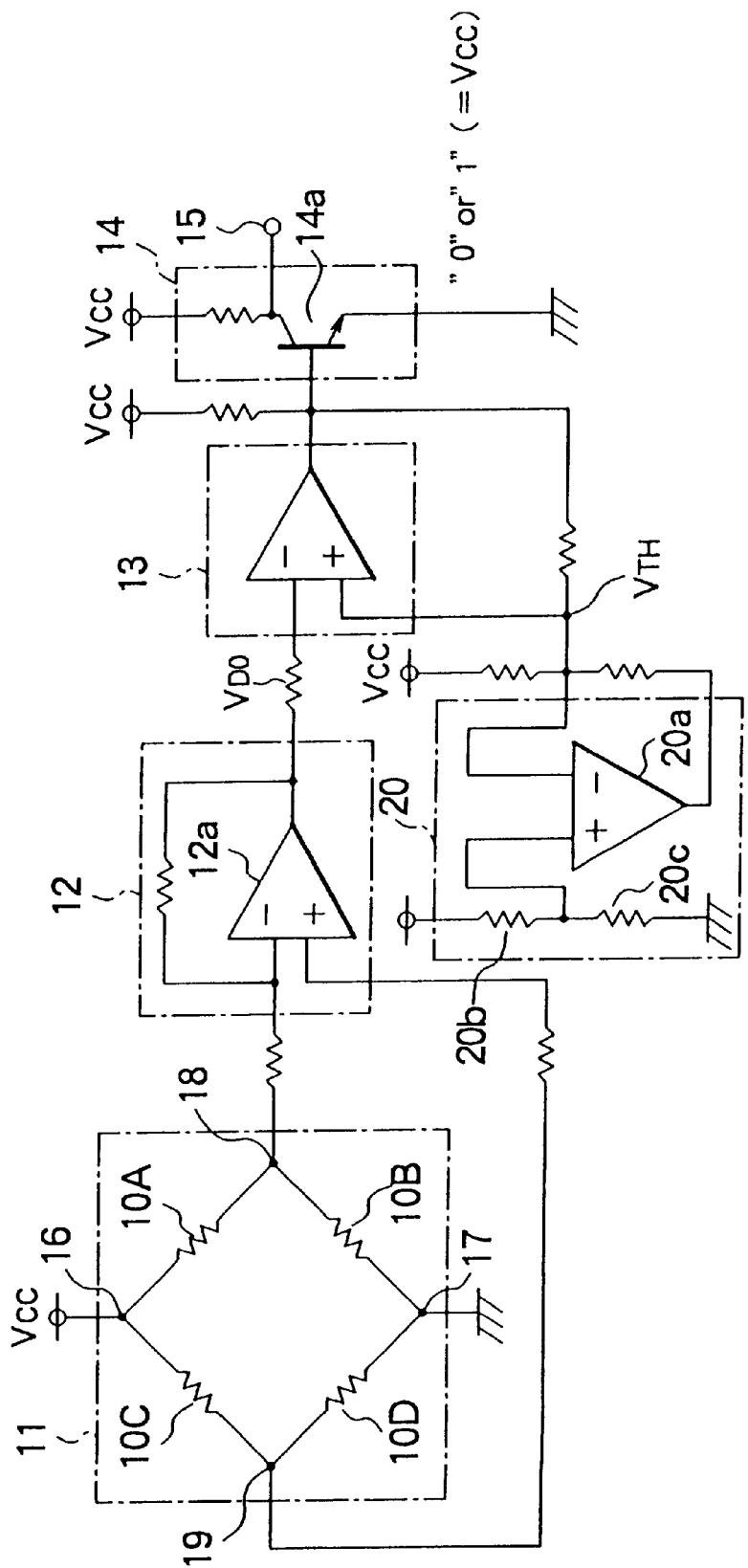
FIG. 11 is a circuit diagram illustrating a specific example of the circuit shown in FIG. 10.
Figure 12A:
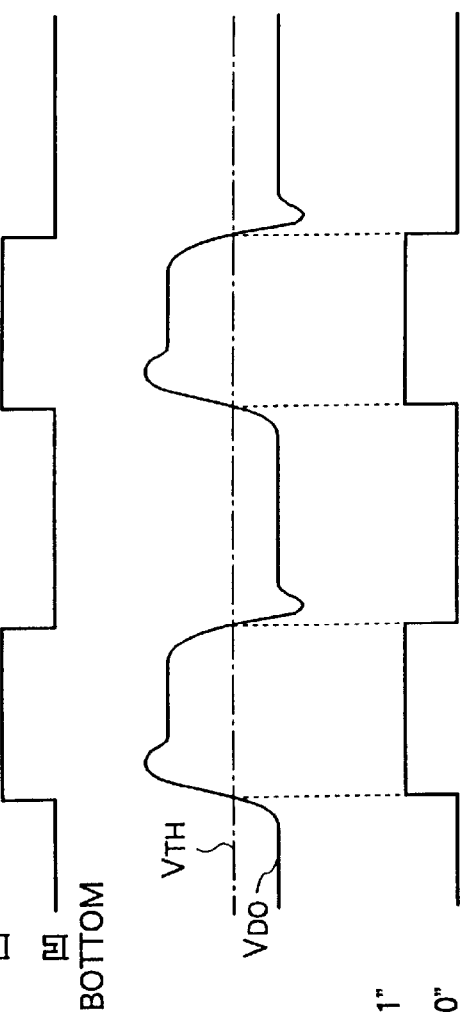

The output voltages $V_{DO1}$ and $V_{DO2}$ of the amplifiers 12a and 12b of the differential amplifier 12A are supplied to the inverting and non-inverting inputs of the comparator 13 and compared to each other. In effect, the comparator 13 detects the crossing point between the output voltages $V_{DO1}$ and $V_{DO2}$ of the amplifiers 12a and 12b corresponding to the protruding and recessed portions of the rotary magnetic material member 2A, wherein if the output voltage $V_{DO1}$ is greater than the output voltage $V_{DO2}$, the comparator 13 outputs a positive signal, while a negative signal is output when the output voltage $V_{DO1}$ is smaller than the output voltage $V_{DO2}$. This means that the comparator 13 does not need a particular reference level as for the conventional example shown in FIG. 11. Thus, the differential amplifier 12A and the comparator 13 form a means for detecting the crossing point between the outputs supplied from the Wheatstone bridge circuit 11A.

Furthermore, even if there are variations in the characteristics and temperature coefficients among GMR elements constituting the Wheatstone bridge circuit 11A, the outputs $V_{DO1}$ and $V_{DO2}$ of the amplifiers 12a and 12b cross each other at a point corresponding exactly to each protruding and recessed portion of the rotary magnetic material member 2A and, thus, the comparator following the differential amplifier can perform precise detection by comparing the outputs $V_{DO1}$ and $V_{DO2}$ with each other, regardless of the variations in the temperature coefficients of the GMR elements. Therefore, the temperature compensation circuit 20, which is used in the conventional circuit shown in FIG. 11 to control the reference level associated with the comparator 13, is no longer necessary in this embodiment.

The signal output from the comparator 13 is then supplied to a waveform shaping circuit 14 and shaped into a square-wave signal. When the output signal of the comparator 13 is positive, a transistor 14a in the waveform shaping circuit 14 is turned on and thus the output level of the waveform shaping circuit 14 becomes zero. On the other hand, if the output signal of the comparator 13 is negative, the transistor 14a in the waveform shaping circuit 14 is turned off and thus the output of the waveform shaping circuit 14 has a positive level with a particular value. As a result, a 0- or 1-level output signal having sharply rising and falling edges is obtained at the output terminal 15 as shown in FIG. 4c, representing the successive protruding and recessed portions of the rotary member of magnetic member 2A.

In the present embodiment, as described above, a plurality of GMR elements, each having hysteresis in the characteristic of the resistance versus applied magnetic field, are disposed so that the centers of the magnetic field sensing planes of the respective GMR elements are shifted from the centers of the magnets, so that the distances for each of the plurality of GMR elements from a rotary magnetic material member are different from each other, whereby an output signal corresponding precisely to the protruding and recessed portions of the rotary magnetic material member can be obtained by comparing a plurality of output signals of differential amplifiers located at a stage following a bridge circuit composed of the GMR elements. In this embodiment, therefore, the reference level is no longer necessary in the operation, and, thus, the above-described fine adjustment of the reference level to an optimum value, which results in a minimum dependence of the gap, is not required.

Furthermore, even if there are variations in the characteristics and temperature coefficients among GMR elements constituting the Wheatstone bridge circuit, the outputs of the plurality of amplifiers of the differential amplifier cross each other at a point corresponding exactly to each protruding and recessed portion of the rotary magnetic material member and, thus, the comparator following the differential amplifier can perform precise detection regardless of the variations in the characteristics or the temperature coefficients of the GMR elements. Therefore, in this embodiment, the temperature compensation circuit, which is required in the conventional technique, is no longer necessary.

Furthermore, since the operation is based on the detection of a crossing point of two signals in the same phase, the operation is less affected by external noise. Thus, it is possible to achieve a small-sized, low-cost, and high-accuracy sensing device capable of providing an output signal corresponding precisely to the successive protruding and recessed portions of the rotary magnetic material member.

Embodiment 2

Figure 5A:
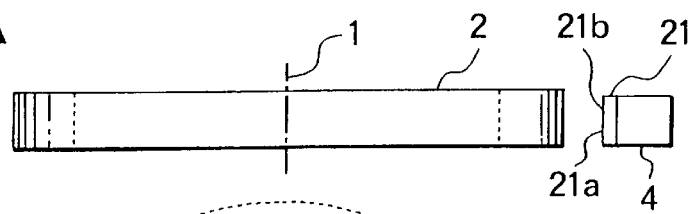
FIGS. 5A and 5B are schematic diagrams illustrating a second embodiment of a sensing device according to the present invention.
Figure 5B:
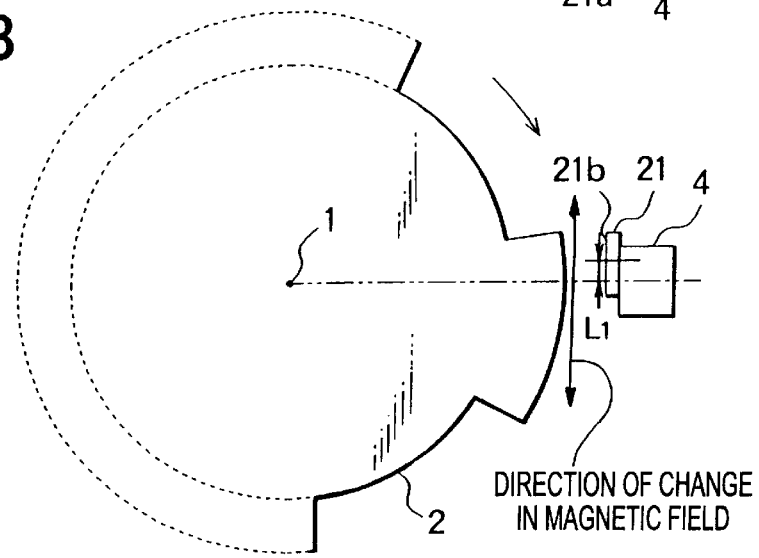

FIG. 5 is a schematic diagram illustrating a second embodiment of the present invention, wherein its side and plan views are shown in FIGS. 5a and 5b, respectively, in which similar elements and parts to those in FIG. 9 are denoted by similar reference numerals, and are not described in further detail here. In the previous embodiment, shown in FIG. 1, a plurality of GMR elements each having hysteresis in the characteristic of the resistance versus applied magnetic field are disposed so that the centers of the magnetic field sensing planes of the respective GMR elements are shifted from the centers of the magnets, so that the distances of the plurality of GMR elements from a rotary magnetic material member are different from each other. Instead, in this embodiment, similar effects are achieved by properly arranging magnetoresistance patterns on the magnetic field sensing plane of GMR elements.

Figure 6:
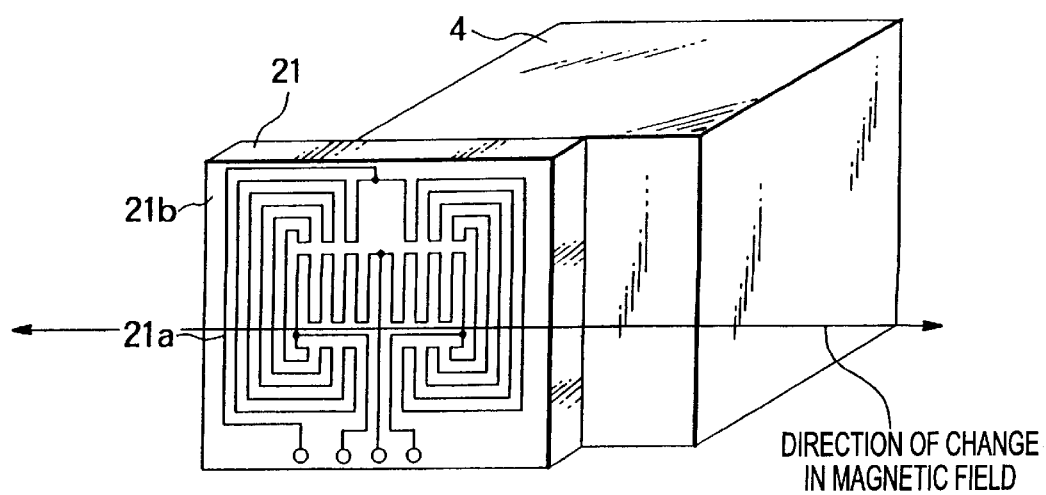
FIG. 6 is a schematic diagram illustrating an example of a magnetoresistance pattern of a GMR element used in the second embodiment of the sensing device according to the present invention.

This sensing device includes: a rotating shaft 1; a rotary magnetic material member 2 having at least one protruding or recessed portion and adapted to rotate in synchronization with the rotation of the rotating shaft 1; a GMR element 21 disposed at a location a predetermined distance apart from the rotary magnetic material member 2; and a magnet for applying a magnetic field to the GMR element 21. As shown in FIG. 6, the GMR element 21 has a magnetic field sensing pattern including a plurality of magnetoresistance patterns 21a formed using thin film on the surface of a magnetic field sensing plane 21b. In this structure, as shown in FIG. 5B, the GMR element 21 is disposed so that the center of the magnetic field sensing plane of the GMR element 21 is shifted by a predetermined amount $L_1$ from the center of the magnet 4, for example, in a direction opposite to the rotation direction of the rotary magnetic material member 2. The specific value of $L_1$ may be selected in a manner similar to the previous embodiment.

In this embodiment, the magnetoresistance patterns 21a are formed on the magnetic field sensing plane 21b of the GMR element 21 in such a manner that a magnetoresistance pattern, serving as a GMR element for generating a larger peak output, is disposed at a location on the magnetic field sensing plane 21b which gives the greatest resistance change and the other magnetoresistance pattern serving as a GMR element for generating a lower peak output is disposed at a location on the magnetic field sensing plane 21b which gives a smaller resistance change, thereby making it possible to obtain a plurality of output signals having different peak values via a differential amplifier of a sensing device. The circuit for the present embodiment may be constructed in the same manner as shown in FIGS. 2 and 3, and thus no further figures for the present embodiment are provided here. Unlike the previous embodiment in which two magnets 4A and 4B are employed as shown in the block diagram of FIG. 2, a single magnet 4 is used in the present embodiment. The operation of the present embodiment is similar to that of the previous embodiment described above with reference to FIGS. 2 and 3, and, thus, it is not described in further detail here.

Figure 7:
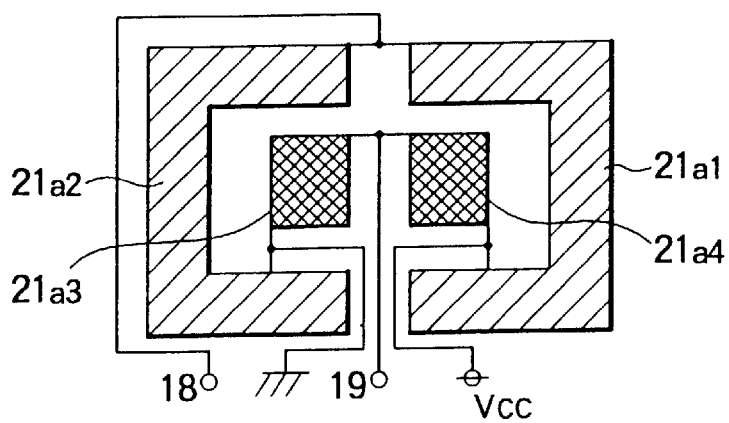
FIG. 7 is an enlarged schematic diagram illustrating the details of the magnetoresistance pattern shown in FIG. 6.

FIG. 7 illustrates an example of the layout of the magnetoresistance patterns of the GMR element according to the present embodiment. As shown in FIG. 7, magnetoresistance patterns $21a_1$, $21a_2$, $21a_3$, and $21a_4$ are formed on the magnetic field sensing plane of the corresponding GMR element such that the magnetoresistance patterns $21a_3$ and $21a_4$, corresponding to the GMR elements $10B_1$ and $10B_2$ of the Wheatstone bridge circuit 11A in FIG. 3, are located at the position of the magnetic field sensing plane which gives a greatest change in the resistance, that is, in the center of the magnetic field sensing plane. On the other hand, the magnetoresistance patterns $21a_1$ and $21a_2$, corresponding to the GMR elements $10A_1$ and $10A_2$, are located at positions surrounding the magnetoresistance patterns $21a_3$ and $21a_4$.

The GMR elements composed of the above magnetoresistance patterns are positioned so that the center of the magnetic field sensing plane 21b is shifted by a predetermined amount $L_1$ from the center of the magnet 4 in a certain direction with respect to the rotary magnetic material member 2. As described above, the GMR elements are located on the respective branches of the Wheatstone bridge 11A shown in FIG. 3 in such a manner that the GMR element corresponding to the magnetoresistance pattern $21a_1$ is located between the nodes 16 and 18, the GMR element corresponding to the magnetoresistance pattern $21a_2$ is located between the nodes 18 and 17, the GMR element corresponding to the magnetoresistance pattern $21a_3$ is located between the nodes 16 and 19, and the GMR element corresponding to the magnetoresistance pattern $21a_4$ is located between the nodes 19 and 17. As a result of the above arrangement, the voltage between the nodes 18 and 17 becomes different from the voltage between the nodes 19 and 17. More specifically, the voltage between the nodes 19 and 17 becomes larger than the voltage between the nodes 18 and 17.

Thus, also in this embodiment, the amplifier 12a of the differential amplifier 12A outputs a voltage $V_{DO1}$ having a smaller peak level while the amplifier 12b outputs a voltage $V_{DO2}$ having a greater peak level. That is, the voltage between the nodes 19 and 17 or the output voltage $V_{DO2}$ of the amplifier 12b is greater in peak level than the output voltage $V_{DO1}$ of the amplifier 12a by an amount resulting from the fact that the magnetoresistance pattern $21a_3$, serving as the GMR element located between the nodes 16 and 19, and the magnetoresistance pattern $21a_4$, serving as the GMR element located between the nodes 19 and 17, are located at the position on the magnetic field sensing plane which gives the greatest change in resistance, while the magnetoresistance pattern $21a_1$, serving as the GMR element located between the nodes 16 and 18, and the magnetoresistance pattern $21a_2$, serving as the GMR element located between the nodes 18 and 17, are located at the position which gives a smaller change in resistance.

The comparator 13 compares the output voltages $V_{DO1}$ and $V_{DO2}$ of the amplifiers 12a and 12b in the differential amplifier 12A with each other. The output signal representing the comparison result is shaped by the waveform shaping circuit 14. As a result, it is possible to obtain a 0- or 1-level output signal which sharply rises and falls at edges corresponding exactly to the protruding and recessed portions of the rotary member of magnetic member 2A.

In the present embodiment, as described above, the GMR elements, having hysteresis in the characteristic of the resistance versus applied magnetic field, are disposed so that the center of the magnetic field sensing plane of the GMR elements is shifted from the center of the magnet, and the magnetoresistance patterns are arranged on the magnetic field sensing plane of the GMR elements in such a manner that the magnetoresistance pattern serving as the GMR element for generating a larger peak output is disposed at a location on the magnetic field sensing plane which gives the greatest resistance change and the other magnetoresistance pattern serving as the GMR element for generating a lower peak output is disposed at a location on the magnetic field sensing plane which gives a smaller resistance change, thereby making it possible to obtain a plurality of output signals having different peak values via the differential amplifier of the sensing device, thereby achieving similar effects to those obtained in the previous embodiment. Furthermore, unlike the previous embodiment, the present embodiment requires only one set of GMR elements and a magnet for applying a magnetic field to the GMR elements. This allows simplification in structure and reduction in the size of the sensing device.

Embodiment 3

Figure 8A:
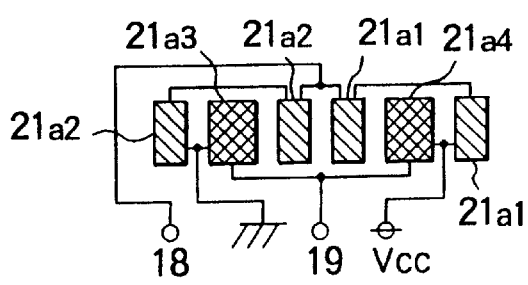
FIGS. 8A and 8B are schematic diagrams illustrating an example of a magnetoresistance pattern of a GMR element used in a third embodiment of a sensing device according to the present invention.
Figure 8B:
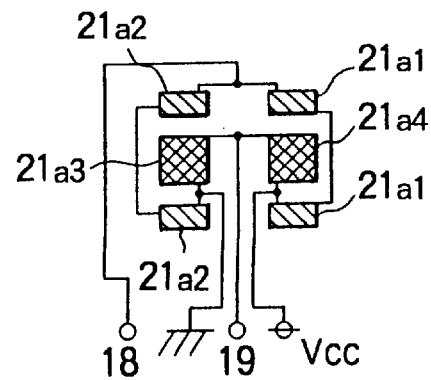

FIGS. 8A and 8B are plan views illustrating a third embodiment of the present invention, wherein similar elements and parts to those in FIG. 7 are denoted by similar reference numerals, and are not described in further detail here. In this embodiment, some of the magnetoresistance patterns formed on the magnetic field sensing plane of the GMR elements shown in FIG. 7 are divided into sub-patterns. In the specific example shown in FIG. 8a, the magnetoresistance patterns $21a_1$ and $21a_2$ are each divided into two parts, and the magnetoresistance patterns are disposed horizontally in the order $21a_2, 21a_3, 21a_2, 21a_1, 21a_4$, and $21a_1$. In the example shown in FIG. 8b, the magnetoresistance patterns $21a_1$ and $21a_2$ are each divided into two parts, and the magnetoresistance patterns $21a_1, 21a_4$, and $21a_1$ are disposed from the top to the bottom on the right side and the magnetoresistance patterns $21a_2, 21a_3$, and $21a_2$ are disposed from the top to the bottom on the left side.

The GMR elements having the above magnetoresistance patterns are positioned so that the center of the magnetic field sensing plane $21b$ is shifted by a predetermined amount $L_1$ from the center of the magnet 4 in a certain direction with respect to the rotary magnetic material member 2. As described above, the GMR elements are located on the respective branches of the Wheatstone bridge 11A shown in FIG. 3 in such a manner that the GMR element having two magnetoresistance patterns $21a_1$ is located between the nodes 16 and 18, the GMR element having two magnetoresistance patterns $21a_2$ is located between the nodes 18 and 17, the GMR element having the magnetoresistance pattern $21a_3$ is located between the nodes 16 and 19, and the GMR element. having the magnetoresistance pattern $21a_4$ is located between the nodes 19 and 17. As a result of the above arrangement, the voltage between the nodes 18 and 17 becomes different from the voltage between the nodes 19 and 17. More specifically, the voltage between the nodes 19 and 17 becomes larger than the voltage between the nodes 18 and 17.

In the case of the pattern arrangement shown in FIG. 8a, the magnetoresistance patterns $21a_3$ and $21a_4$ are located at a position corresponding to the peak of the change in resistance, and the magnetoresistance patterns $21a_2$ and $21a_1$, located on either side of the magnetoresistance patterns $21a_3$ and $21a_4$, are located at positions corresponding to a certain region of the resistance characteristic in which the resistance changes at a certain gradient. Thus, the present embodiment can also achieve similar effects to those obtained in the second embodiment described above.

Embodiment 4

Although, in the previous embodiments, a rotary magnetic material member, which rotates in synchronization of the rotation of a rotating shaft, is employed as a moving member of magnetic material serving as magnetic field applying means, similar effects may also be achieved by employing a moving member of a magnetic material which moves linearly.

What is claimed is:

1. A sensing device comprising:

a single magnet for generating a magnetic field;

magnetic field variation inducing means for changing the magnetic field generated by said magnet, said magnetic field variation inducing means being disposed a predetermined distance apart from said magnet; and a giant magnetoresistance disposed between said magnet and said magnetic field variation inducing means in the path of said generated magnetic field having a magnetic field sensing plane, said giant magnetoresistance detecting the change in the magnetic field induced by said magnetic field variation inducing means and generating a plurality of outputs having peak voltage values different from each other, said giant magnetoresistance including a plurality of magnetoresistance patterns formed on the magnetic field sensing plane, said plurality of magnetoresistance patterns being located at positions corresponding to said plurality of outputs having different peak voltage values, the magnetoresistance pattern for generating an output having the greatest peak voltage value of said plurality of magnetoresistance patterns being located at a position which results in the greatest change in resistance in relation to the positions of others of said plurality of magnetoresistance patterns, as a result of the change in magnetic field induced by said magnetic field variation inducing means.

2. A sensing device as claimed in claim 1, wherein:

a bridge circuit is constructed using said plurality of giant magnetoresistance patterns;

and wherein a magnetic field is applied to said plurality of giant magnetoresistance patterns in such a manner that the magnetic field applied to a giant magnetoresistance pattern located on one side of said bridge circuit is different in polarity from that applied to a giant magnetoresistance pattern located on another side of said bridge circuit.

3. A sensing device as claimed in claim 2, further comprising means for detecting a crossing point between the outputs of the giant magnetoresistance patterns located on the respective branches of said bridge circuit.

4. A sensing device as claimed in claim 3, wherein said means for detecting the crossing point comprises a differential amplifier having a plurality of amplifiers for amplifying the mid-point voltage of said bridge circuit, and a comparator for comparing the outputs of said plurality of amplifiers with each other.

* * * * *